(12) United States Patent
Shi et al.

(10) Patent No.: US 7,470,564 B2
(45) Date of Patent: *Dec. 30, 2008

(54) FLIP-CHIP SYSTEM AND METHOD OF MAKING SAME

(75) Inventors: Song-Hua Shi, Phoenix, AZ (US); Tian-An Chen, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 323 days.

This patent is subject to a terminal disclaimer.

(21) Appl. No.: 10/281,844

(22) Filed: Oct. 28, 2002

(65) Prior Publication Data

US 2004/0082107 A1  Apr. 29, 2004

(51) Int. Cl.
*H01L 21/00* (2006.01)
*H01L 21/44* (2006.01)

(52) U.S. Cl. .................. 438/108; 438/118; 438/613; 257/E21.503

(58) Field of Classification Search .............. 257/778, 257/787, 788, 789, E21.503; 438/108, 118, 438/613
See application file for complete search history.

(56) References Cited

U.S. PATENT DOCUMENTS

| | | | | |
|---|---|---|---|---|
| 6,180,696 | B1 * | 1/2001 | Wong et al. | 523/457 |
| 6,586,843 | B2 * | 7/2003 | Sterrett et al. | 257/778 |
| 6,649,446 | B1 * | 11/2003 | Goetz et al. | 438/110 |
| 6,730,540 | B2 * | 5/2004 | Siniaguine | 438/107 |
| 6,794,761 | B2 * | 9/2004 | Shi et al. | 257/787 |
| 6,841,415 | B2 * | 1/2005 | Suzuki et al. | 438/106 |
| 6,969,914 | B2 * | 11/2005 | Fuller et al. | 257/780 |
| 2001/0014399 | A1 * | 8/2001 | Jasne | 428/413 |
| 2003/0080437 | A1 * | 5/2003 | Gonzalez et al. | 257/778 |
| 2003/0226254 | A1 * | 12/2003 | Koning et al. | 29/832 |
| 2005/0054143 | A1 * | 3/2005 | Skokov et al. | 438/123 |

FOREIGN PATENT DOCUMENTS

| | | |
|---|---|---|
| WO | WO-9921226 A1 | 4/1999 |
| WO | WO-0031183 A1 | 6/2000 |
| WO | WO-03036692 A2 | 5/2003 |

OTHER PUBLICATIONS

Garrou et al. . (NPL: Underfill Adhesion to BCB(CycloteneTM) Bumping and Redistribution Dielectrics) Aug. 2000, IEEE Transctions on advanced packaging, vol. 23, No. 3, p. 568-573.*
Chan, Y. C., et al., "The Effect of Metal Oxide on the No-Flow Underfill Fluxing Capacity", *Materials Science and Engineering*, B85, (Aug. 6, 2001), 64-69.
Vo, H. T., et al., "Towards Model-Based Engineering of Underfill Materials: CTE Modeling", *Microelectronics Journal*, 32, (Apr. 1, 2001), 331-338.

\* cited by examiner

*Primary Examiner*—Walter L Lindsay, Jr.
*Assistant Examiner*—Ron E Pompey
(74) *Attorney, Agent, or Firm*—John N. Greaves

(57) ABSTRACT

A system for underfilling in a chip package includes an underfill mixture that ameliorates the CTE mismatch that typically exists between a packaged die and a resin-impregnated fiberglass mounting substrate. In one embodiment, the system includes an underfill mixture that alone exhibits a CTE that is characteristic of an inorganic-filled underfill composite previously known. An embodiment is also directed to the assembly of a flip-chip package that uses an underfill mixture.

17 Claims, 3 Drawing Sheets

FLIP-CHIP SYSTEM AND METHOD OF MAKING SAME

TECHNICAL FIELD

Embodiments of the present invention relate to a packaged semiconductive die with integrated circuitry. More particularly, an embodiment relates to bonding a packaged die to a board with an underfill mixture that includes properties similar to a particulate-filled underfill composite.

BACKGROUND INFORMATION

Flip-chip technology is well known in the art for electrically connecting a die (hereinafter, a "chip" or "flip-chip") to a mounting substrate such as a printed wiring board.

The active surface of the die is subject to numerous electrical couplings that are usually brought to the edge of the chip. Heat generation is significant at the active surface of the die, and consequently at the active surface of the chip. Electrical connections, referred variously to as balls, bumps, and others, are deposited as terminals on the active surface of a flip-chip. The bumps include solders and/or plastics that make mechanical connections and electrical couplings to a substrate. The chip is inverted (hence, "flip-chip") onto a mounting substrate with the bumps aligned to bonding pads on the mounting substrate. If the bumps are solder bumps, the solder bumps on the flip-chip are soldered to the bonding pads on the substrate. A gap exists between the flip-chip active surface and the mounting substrate.

One electronic device includes a flip-chip and mounting substrate, among other things. One characteristic of flip-chip technology is shear stress on the solder joints during temperature cycling of the device. This shear stress is partially a result of a difference in the coefficients of thermal expansion ("CTE") of the flip-chip and the mounting substrate. Die materials such as silicon, germanium, and gallium arsenide, along with their packaging materials, may have CTEs in a range from about 3 ppm/° C. to about 6 ppm/° C. Mounting substrates are usually composites of organic-impregnated fiberglass dielectrics and metallic circuitry. These substrates may have CTEs in a range from about 15 ppm/° C. to about 25 ppm/° C. Consequently, a mismatch in the CTEs exists between the flip-chip and the mounting substrate.

To reduce solder joint failures due to stress during thermal cycling, the solder joints are reinforced by filling the space between the flip-chip and the mounting substrate, and around the solder joints, with an underfill composite. The two main processes that are commonly used to underfill the flip-chip include the capillary underfill process and the no-flow underfill process.

A capillary underfill process typically proceeds by first aligning the solder bumps on a flip-chip with the pads on a substrate and the solder is reflowed to form the solder joints. After forming the interconnect, the underfill is flowed between the flip-chip and the mounting substrate. Thereafter, the underfill composite is cured. Capillary underfilling can be assisted by pumping the underfill composite between the flip-chip and the mounting substrate, or by vacuum-assisted drawing the underfill composite between the flip-chip and the mounting substrate.

The effectiveness of an underfill composite depends on its chemical, physical, and mechanical properties. Properties that make an underfill composite desirable include low CTE, low moisture uptake, high adhesion, high toughness, high glass transition (Tg) temperature, high heat distortion temperature, and others. The underfill composite includes particulate filler inorganics such as silica or the like, and metal flakes or the like. The particulate filler increases the modulus and acts as a CTE intermediary for the mismatched CTEs of flip-chip and the mounting substrate. An example of a silica-filled composite is silica-filled, epoxy-based organics. However, the capillary underfill process that includes silica-filled composites or the like has technical challenges that are tedious, expensive, and sensitive to process rules and to chip size and shape. For example, particulate fillers in the underfill composite cause flowability to decrease between the flip-chip active surface and the mounting substrate upper surface. Further, flow around the electrical bumps is also hindered by the increasingly smaller pitch and the increasingly smaller spacing between the flip-chip and the mounting substrate.

The no-flow underfill process avoids some challenges in the capillary flow underfill processes. In a no-flow underfill process, the underfill composite is dispensed on the mounting substrate or the flip-chip, and the flip-chip and the mounting substrate are brought into contact. The solder bumps on the chip and the pads on the substrate are aligned. Next, the underfill composite is cured prior to or substantially simultaneously with reflowing the solder to create the solder joints.

The no-flow underfill process also has technical challenges. The no-flow underfill material also must be made into a composite with the addition of a filler of silica or the like. Silica filler reduces the bump interconnection yield, because the filler gets deposited between the bumps and the pads such that electrical connections are not achieved.

BRIEF DESCRIPTION OF THE DRAWINGS

In order to understand the manner in which embodiments of the present invention are obtained, a more particular description of various embodiments of the invention briefly described above will be rendered by reference to the appended drawings. Understanding that these drawings depict only typical embodiments of the invention that are not necessarily drawn to scale and are not therefore to be considered to be limiting of its scope, the embodiments of the invention will be described and explained with additional specificity and detail through the use of the accompanying drawings in which.

DETAILED DESCRIPTION

One embodiment relates to a system that includes a flip-chip and a mounting substrate with an underfill mixture that exhibits a coefficient of thermal expansion (CTE) that is characteristic of inorganic-filled underfill composites previously known, among other properties. The underfill mixture includes a principal underfill composition selected from superoxiranes, benzocyclobutenes, combinations thereof, and others as will be further delineated according to various embodiments.

One embodiment includes a method of assembling the flip-chip and the mounting substrate.

The following description includes terms, such as "upper", "lower", "first", "second", etc. that are used for descriptive purposes only and are not to be construed as limiting. The embodiments of a device or article of the present invention described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. The term "chip" as used herein refers to a die that has been encapsulated in an organic, an inorganic, or a combination organic and inorganic housing. A "board" is typically a resin-impregnated fiberglass structure that acts as a mounting substrate for the chip.

Figure 1A:
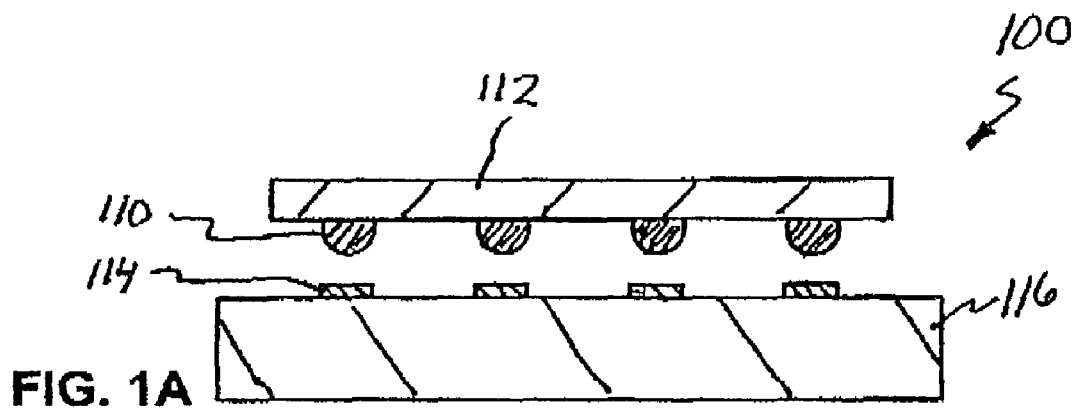
FIG. 1A is a cross-section of a package during an underfill process according to an embodiment.

FIG. 1A is a cross-section of a package during an underfill process according to an embodiment. In FIG. 1, a package 100 is depicted during a capillary underfill process. The package 100 includes a solder bump 110 that is attached to a flip-chip 112. Electrical coupling for the flip-chip 112 is accomplished through a bond pad 114 that is landed on a mounting substrate 116.

Figure 1B:
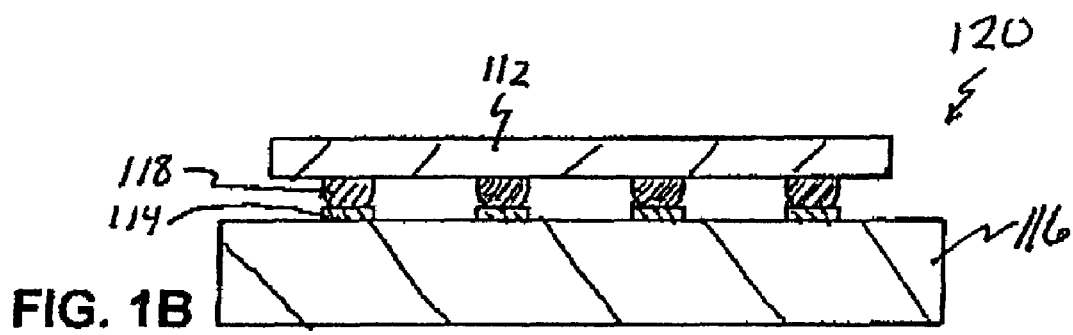
FIG. 1B is a cross-section of the package depicted in FIG. 1A after further processing.

FIG. 1B is a cross-section of the package depicted in FIG. 1A after further processing. In FIG. 1B, the flip-chip 112 and the mounting substrate 116 are aligned and brought together. Next, reflow of the solder bump 118 is carried out. A reflowed solder bump 118 is depicted, and a flip-chip assembly 120 includes the flip-chip 112 and the mounting substrate 116 as bonded.

Figure 1C:
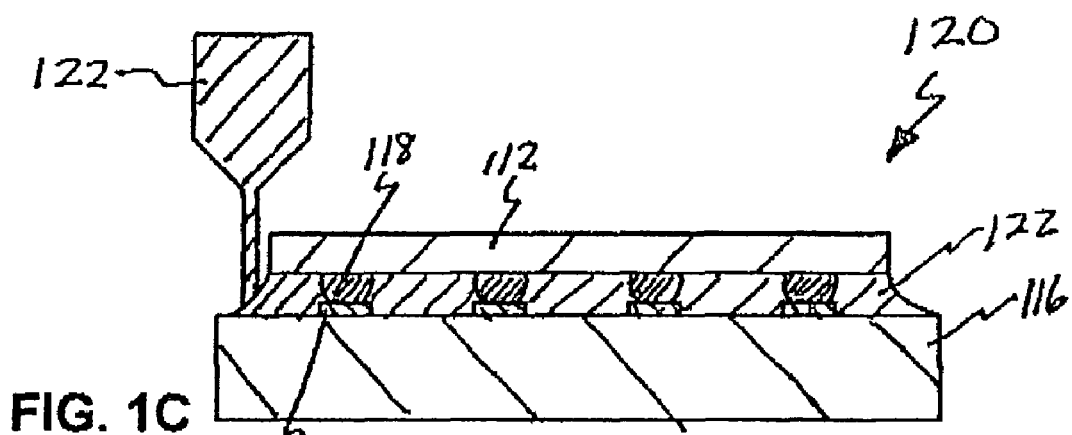
FIG. 1C is a cross-section of the package depicted in FIG. 1B after further processing.

FIG. 1C is a cross-section of the package depicted in FIG. 1B after further processing. An underfill mixture 122 according to an embodiment is applied to the flip-chip assembly 120 under conditions that cause a wicking action of the underfill mixture between the flip-chip 112 and the mounting substrate 116. Underfill mixture 122 has unique formulations, according to various embodiments, and will be described below in greater detail.

Figure 1D:
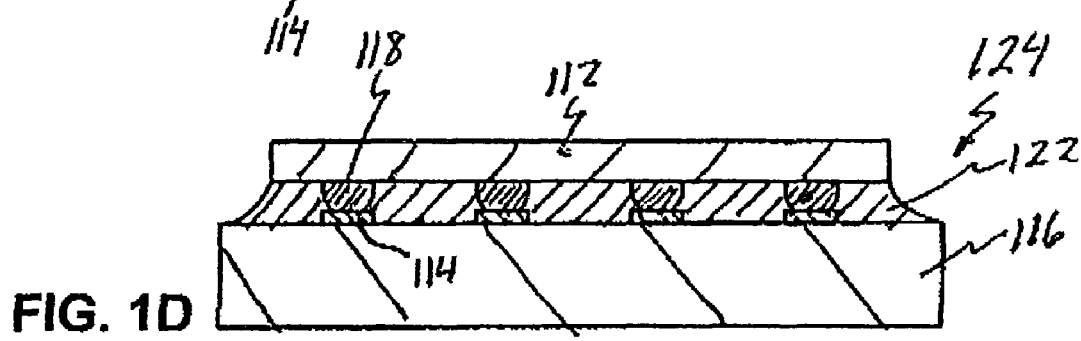
FIG. 1D is a cross-section of the package depicted in FIG. 1C after further processing.

FIG. 1D is a cross-section of the package depicted in FIG. 1C after further processing. A curing process is carried out to achieve a chip package 124. The curing process is carried out according to specific embodiments. In one embodiment, curing the mixture is done by an autocatalytic process. The autocatalytic process is carried out in one embodiment by providing a reactive diluent in the underfill mixture 122. In another embodiment, the curing process is carried out by an additive catalytic curing process. The additive catalytic curing process includes an additive such as a metal catalyst powder that causes the underfill mixture 122 to cure. In another embodiment, a cross-linking/hardening process is carried out to cure the underfill mixture 122. Examples of specific cross-linker/hardener composition are set forth herein. In another embodiment, a thermoset curing process is carried out. Typically, several curing process embodiments are assisted by thermal treatment. However, in some embodiments, such as the use of a liquid crystal thermoset monomer, thermoset processing may be done without other curing agent processes.

Figure 2A:
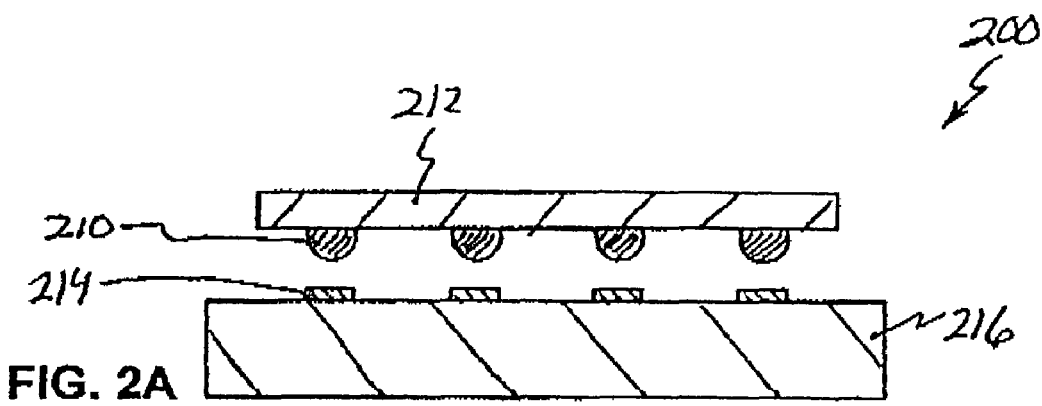
FIG. 2A is a cross-section of a package during a no-flow underfill process according to an embodiment.

FIG. 2A is a cross-section of a package 200 during a no-flow underfill process according to an embodiment. The package 200 includes a solder bump 210 that is attached to a flip-chip 212. Electrical coupling for the flip-chip 212 is accomplished through a bond pad 214 that is landed on a mounting substrate 216.

Figure 2B:
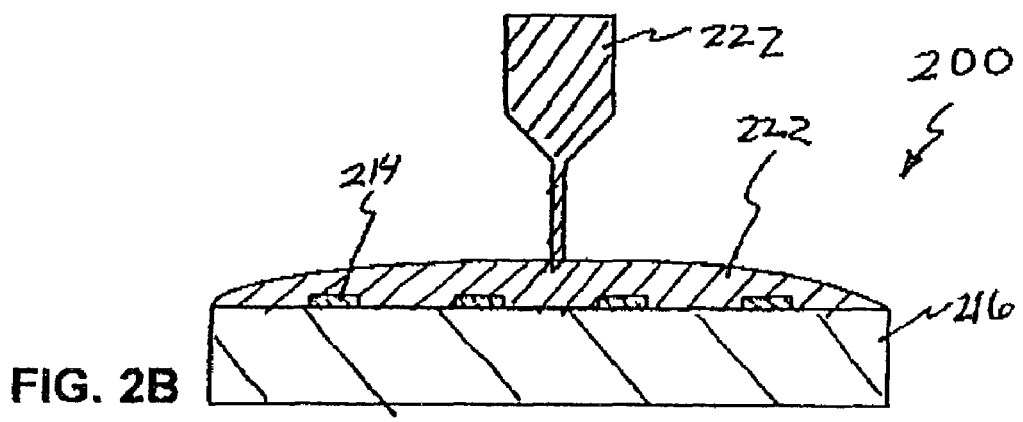
FIG. 2B is a cross-section of the package depicted in FIG. 2A after further processing.

FIG. 2B is a cross-section of the package 200 depicted in FIG. 2A after further processing. An underfill mixture 222 according to an embodiment is applied, either to the flip-chip 212 or to the mounting substrate 216. In FIG. 2B, the underfill mixture 222 is depicted as being deposited upon the mounting substrate 116, although it may alternatively deposited upon the flip-chip 212 (FIG. 2A). Underfill mixture 222 has unique formulations, according to various embodiments, and will be described below in greater detail.

Figure 2C:
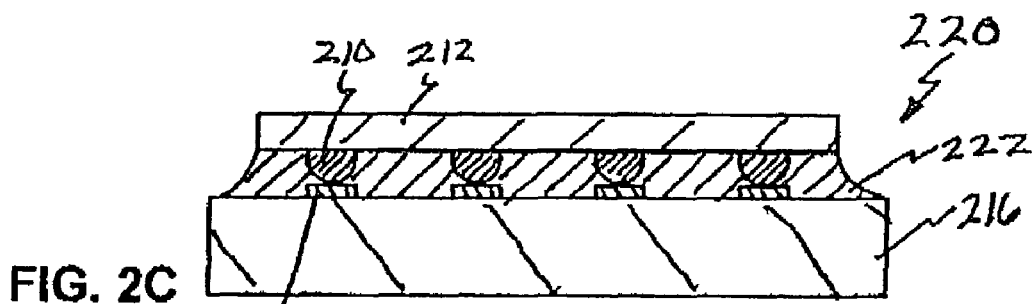
FIG. 2C is a cross-section of the package depicted in FIG. 2B after further processing.

FIG. 2C is a cross-section of the package 200 depicted in FIG. 2B after further processing. Next, the flip-chip 212 and the mounting substrate 216 are aligned and brought together to form a flip-chip assembly 220 that includes the uncured underfill mixture 222 and the not yet reflowed solder bump 210.

Figure 2D:
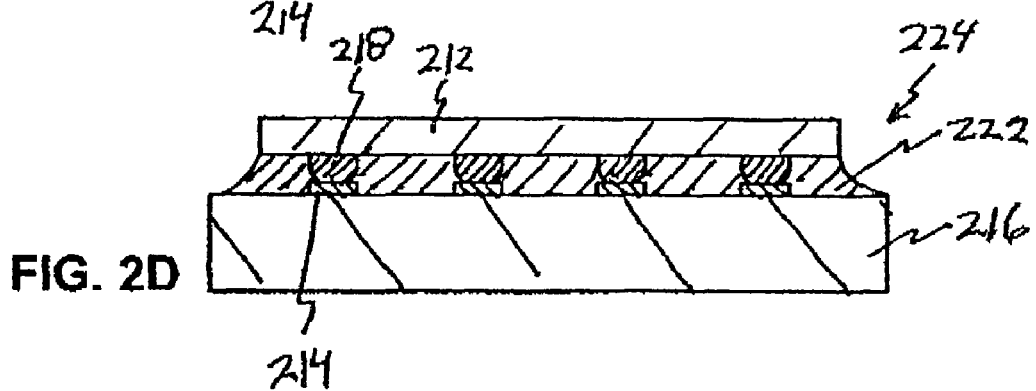
FIG. 2D is a cross-section of the package depicted in FIG. 2C after further processing.

FIG. 2D is an elevational cross-section of the flip-chip assembly 220 depicted in FIG. 2C after further processing. A curing process is carried out to achieve a chip package 224. The curing process is carried out according to specific embodiments. In one embodiment, curing is followed by reflowing of the solder bump 210 (FIG. 2C) onto the bond pad 214 to form a reflowed solder bump 218. In another embodiment, curing and reflowing are carried out substantially simultaneously. As in the embodiment depicted in FIGS. 1C and 1D, curing may be carried out by various processing paths including autocatalytic, additive catalytic, diluent cross-linking/hardening, thermoset, and a combination thereof.

According to an embodiment, the solder bumps 110 and 210 include substantially Pb-free solder technology that is being developed in the art. In another embodiment, the solder bumps 110 and 210 are Pb-containing solder. By "substantially Pb-free solder", it is meant that the solder is not designed with Pb content according to industry trends.

One example of a Pb-containing solder includes a tin-lead solder. In selected embodiments, Pb-containing solder is a tin-lead solder composition such as from Sn97Pb. A tin-lead solder composition that may be used or a Sn37Pb composition. In any event, the Pb-containing solder may be a tin-lead solder comprising $Sn_xPb_y$, wherein x+y total 1, and wherein x is in a range from about 0.3 to about 0.99. In one embodiment, the Pb-containing solder is a tin-lead solder composition of Sn97Pb. In another embodiment, the Pb-containing solder is a tin-lead solder composition of Sn37Pb.

A substantially Pb-free solder in one embodiment includes an Sn90-98Ag10-2Cu2-0 solder as is known in the art. Specifically one such composition is $Sn_{97}Ag_{2.5}Cu_{0.5}$ Underfill Formulations One embodiment relates to achieving an underfill mixture that includes physical properties of the previously known underfill composites that included inorganic particles. The previously known underfill composites had coefficients of thermal expansion (CTEs) that were between the CTEs of the chip and the board. Accordingly, some embodiments include underfill mixtures that have a range of compositions and combinations, so long as they have minimal overall physical properties of the previously known underfill composites.

Some desirable properties of underfill mixtures include a high modulus, low viscosity at the time of dispensing onto a chip and/or substrate, low CTE and good adhesion to the interfaces post cure, so that no delamination at the interface occurs during device testing and field use. Some other desirable properties of underfill mixtures include a high glass-transition (Tg) temperature, and a low moisture uptake.

According to various embodiments, the principal underfill compositions include at least one of superoxiranes, benzocyclobutenes, and combinations thereof.

Additive Materials

Additive materials are included with the principal underfill compositions. The additive materials and the principal underfill compositions constitute "underfill mixtures" according to embodiments set forth herein.

One additive material according to an embodiment is an elastomer for imparting flexibility to the principal underfill composition. Another additive material according to an embodiment is a hardener/crosslinker. The specific hardener/crosslinker that is employed will depend upon compatibility with the principal underfill composition. Hardeners/crosslinkers can be both aromatic and aliphatic in nature. The hardener/crosslinker in one embodiment is an anhydride composition. In another embodiment, the hardener/crosslinker is an amine.

Another additive material according to an embodiment is a catalyst. The specific catalyst that is employed will depend upon compatibility with the principal underfill composition. Some catalysts for the above principal underfill compounds according to embodiments include imidizole and its derivatives, amines, and triphenylphosphine. Suitable anhydride hardners include nadic anhydride, methyl cyclohexy anhydride, pthalic anhydride, or the like. Other suitable examples include, methylene diamine, di-aminodiphenyl sulfone, or the like.

Another additive material according to an embodiment is a reactive diluent. The specific reactive diluent that is employed will depend upon compatibility with the principal underfill composition. Because of the bonding and sealing nature of the process embodiments, the reactive diluent reacts and/or dissolves into the final underfill mixture instead of volatilizes. Reactive diluents for the above principal underfill compounds according to embodiments of the present invention include other low viscosity epoxy monomers such as Bi-phenyl epoxy, Bis-Phenol A epoxy, Bis-Phenol F epoxy, or the like. Other epoxies include phenyl glycidyl ethers, nonyl phenyl glycidyl ethers, p-butylphenyl glycidyl ethers, alkyl C8-C14 glycidyl ethers, cyclo aliphatic epoxies and the like.

Another additive material according to an embodiment is an adhesion promoter. The specific adhesion promoter that is employed will depend upon compatibility with the principal underfill composition. Adhesion promoters that can be added to the above underfill compositions include organic and inorganic combinations. In one embodiment, a silane coupling agent is used as an adhesion promoter. In another embodiment, an organo-ziconate composition is used as an adhesion promoter. In one embodiment, an organo-titanate composition is used as an adhesion promoter.

Another additive material according to an embodiment is a flow modifier such as a surfactant. The specific flow modifier that is employed will depend upon compatibility with the principal underfill composition. The surfactant requires properties such as compatibility with the principal underfill composition. In one embodiment, the surfactant is anionic such as long chain alkyl carboxylic acids, such as lauric acids, steric acids, and the like. In another embodiment, the surfactant is nonioninc. Examples of nonionic surfactants are polyethtlene oxides, poly propylene oxides, and the like. In yet another embodiment, the surfactant is cationic such as alkyl ammonium salts such as terta butyl ammonium chlorides, or hydroxides.

Another additive material according to an embodiment is a deforming agent. The specific deforming agent that is employed will depend upon compatibility with the principal underfill composition. The deforming agent is also referred to as a plasticizer.

Another additive material according to an embodiment is a fluxing agent. Fluxing agents are mainly useful in no-flow underfill materials applications according to embodiments, including acids that can be dissolved in mixtures of the base resins and the cross-linking agents. One fluxing agent type includes organic carboxylic acids and the like. Another fluxing agent type includes polymeric fluxing agents and the like. The examples of fluxing agents are any chemicals containing hydroxyl (—OH) group or carboxylic (—COOH) group or both, such as glycerin, ethylene glycol, tartaric acid, adipic acid, citric acid, malic acid, meilic acid, and glutaric acid.

Another additive material according to an embodiment is a toughening agent. A toughening agent causes the underfill mixture to resist crack propagation. In one embodiment, an elastomer is used as the toughening agent. The specific elastomer that is employed to toughen the matrix will depend upon compatibility with the principal underfill composition. For example, an elastomer that is used with epoxy-functionalized compositions is carboxy-terminated polybutadiene-acrylonitrile (CTBN). CTBN is the generic name for a family of elastomer additives for epoxies, with the primary elastomer being functionalized butadine-acrylonitrile copolymer. These elastomers are available as epoxy, carboxy, amino and vinyl terminal functionalities. Other elastomers may be used that are compatible with a given underfill composition.

Another additive material according to an embodiment is an inorganic filler. Inorganic filler particles that optionally are added to the underfill mixtures include oxides of various elements such as silica, alumina, and others. Other inorganic filler particles include nitrides such as silicon nitride and the like. Other inorganic filler particles include conductive materials such as graphite, diamond, and the like. When added, the underfill mixture is more appropriately referred to as an "underfill composite", in that it has inorganic filler particles as existing technology does, but it includes a principal underfill composition according to various embodiments. The underfill composite embodiments, unlike most other embodiments, include a more-than-one-phase substance. For purposes of this disclosure, an underfill mixture can be a composite as defined herein. Where an underfill mixture is referred to as a "single phase material", the reference is to the absence of a filler particulate, and not to the degree of solid solution homogeneity of the principal underfill composition with the various additive materials, etc.

Principal Underfill Compositions and Underfill Mixtures

The principal underfill compositions, as set forth above, include various embodiments and their equivalents. The following non-limiting discussion of various principal underfill compositions relates to superoxiranes, benzocyclobutanes, and others that contribute to a low CTE underfill mixture or composite. Other compositions may be selected to impart similar final properties of underfill mixtures or underfill composites.

Superoxirane Resins

In a first general embodiment, a superoxirane resin is provided as the principal underfill mixture. One example of a superoxirane resin has the following structure.

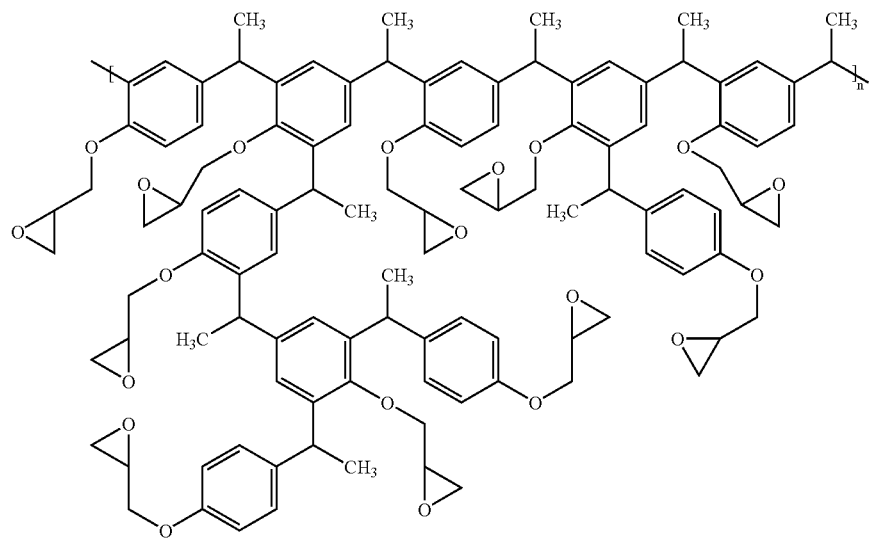

It is noted that this example of a superoxirane resin has been functionalized by epoxy functional groups. In one embodiment, an epoxy-functionalized superoxirane resin is functionalized in a range from about 5 to about 200. In another embodiment, the epoxy-functionalized superoxirane resin is functionalized in a range from about 8 to about 100. In another embodiment, the epoxy-functionalized superoxirane resin is functionalized in a range from about 16 to about 64.

In one embodiment, a superoxirane is mixed with other monomers before functionalizing. For example, the superoxirane is prepared as an epoxy monomer, and it is mixed with a monomer, such as Bi-phenyl epoxy, or the like. In another example, the superoxirane is prepared as an epoxy monomer, and it is mixed with a monomer, such as Bis-Phenol A epoxy, Bis-Phenol F epoxy, mixtures thereof, or the like. In another example, the superoxirane is prepared as an epoxy monomer, and it is mixed with a monomer, such as cyclo aliphatic epoxy, or the like.

The following are epoxy functionalized superoxirane mixture embodiments that are processed according to process embodiments.

EXAMPLE 1

In Example 1, reference is made to FIGS. 1A-1D. The flip-chip 112 is aligned with the mounting substrate 116, and the solder bump 110 is reflowed according to known technique. The underfill mixture 122 is fed to an edge of the flip-chip 112, and the underfill mixture 122 flows by capillary action to fill interstitially between the flip-chip 112 and the mounting substrate 116. Thereafter, the underfill mixture 122 is cured by thermal processing. The underfill mixture 122 in this example includes the oxirane functionalized superoxirane resin depicted above Additionally, the functionalized superoxirane is mixed with low viscosity bis-phenyl F epoxy resin about 40 wt % of the mixture and blended with 2-ethyl-4-methyl imidazole hardener/cross-linker, about 4 wt % of the mixture.

EXAMPLE 2

In a first alternative to Example 1, the same superoxirane system is prepared, and an epoxy silane adhesion promoter, about 0.4 wt % of the mixture is used with diamine based polyoxyethylene/polyoxypropylene flow modifier, about 0.2 wt % of the mixture.

EXAMPLE 3

In a second alternative to Example 1, the same superoxirane system is prepared, and an inorganic particulate of at least one of fused silica about 40 wt % of the mixture, is included in the mixture to comprise an underfill composite.

EXAMPLE 4

In another embodiment, Example 4, the process depicted in FIGS. 2A-2D is followed. The underfill mixture 222 is prepared solvent-free and is deposited upon the mounting substrate 216. The flip-chip 212 and the mounting substrate 216 are aligned and brought together. The underfill mixture 222 is first cured by thermal processing, and thereafter the bump 210 is reflowed according to known technique. The superoxirane in the underfill mixture 222 in this example is the same as used in Example 2. Additionally, the functionalized superoxirane set forth above is blended with 2-ethyl-4-methyl imidazole hardener/crosslinker, about 4 wt % of the mixture and glutaric acid fluxing agent, about 2.5 wt % of the mixture.

EXAMPLE 5

In an alternative to Example 4, the same superoxirane system is prepared with epoxy silane adhesion promoter, about 0.4 wt % of the mixture and diamine based polyoxyethylene/polyoxypropylene flow modifier, about 0.2 wt % of the mixture.

EXAMPLE 6

In a second alternative to Example 3, the same superoxirane system is prepared, and an inorganic particulate of silica is included in the mixture, about 40 wt % of the mixture, to comprise an underfill composite.

Typically, the superoxirane-based underfill materials are cured by subjecting the underfill material to a temperature of at least about 160° C._ and at most about 220° C. degrees for a period of time between 0.5 hr and 4 hrs.

Once cured, the superoxirane-containing underfill mixture exhibits a combination of properties that make the materials an improvement over prior art underfill composites. These properties include low CTE, high Tg, high modulus, low moisture uptake, high heat distortion temperature, high elongation, and low volume shrinkage.

| Property | Typical value for cured pure superoxirane resin | Value for cured superoxirane resin with additives |
|---|---|---|
| CTE (PPM/° C.) | 33 | 20-50 |
| Tg (° C.) | 280 | 160-300 |
| Tensile Modulus (MPa) | 5800 | 4000-12000 |
| Tensile strength (MPa) | 11.7 | >11.7 |
| Moisture uptake | 0.95% | 0.1%-1.0% |
| Elongation | 3.1% | 2%-4% |

Benzocyclobutene Resins

In a second general embodiment, the present invention provides a principal underfill material that includes benzocyclobutene (BCB) resins. BCB resins are sometimes referred to as cyclotene. BCB resins are oligomers or polymers that are polymerized divinylsiloxanebisbenzocyclobutene (BCB monomer). The chemical structure of the BCB monomer is shown below:

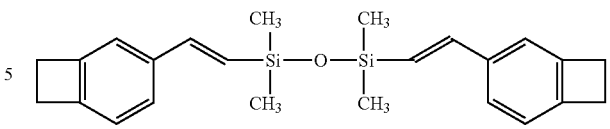

Upon heating, the benzocyclobutene group of the BCB monomer condenses with the vinyl group of an adjacent BCB monomer to form a dimer (BCB dimer). The chemical structure of the BCB dimer is shown below:

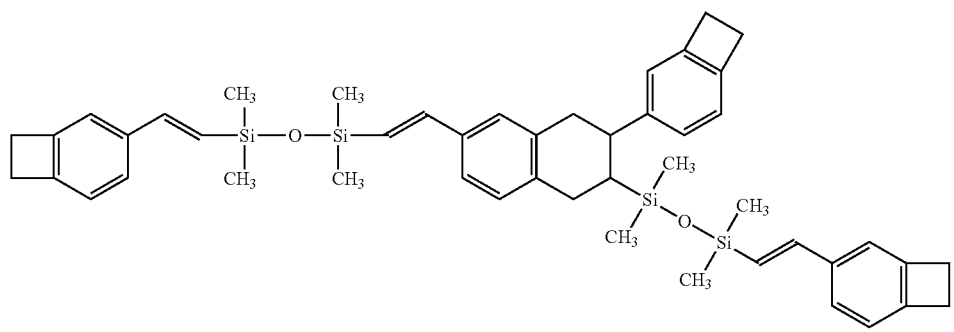

The BCB dimer can be further oligomerized, cross-linked, and polymerized. Thus, the BCB principal underfill composition embodiments of the present invention are dimers, oligomers, and polymers containing, in the backbone, a dimethyl siloxane/benzocyclohexane hybrid structure as is shown above in the BCB dimer structure. BCB resins useful in underfill mixtures according to various embodiments include BCB dimers, BCB polymers having a longer polymer backbone than the BCB dimer, and derivatives of BCB dimers and polymers.

Various additive materials are used to form a BCB mixture according to an embodiment. The functionalized BCBs are also mixed with other principal underfill compositions, additive materials, and/or with particles in order to achieve specific physical qualities. Such additive materials that are used to form a mixture with the BCB principal are set forth above.

The following are BCB mixture embodiments that are processed according to process embodiments.

EXAMPLE 7

In Example 7, reference is made to FIGS. 1A-1D. The flip-chip 112 is aligned with the mounting substrate 116, and the solder bump 110 is reflowed according to known technique. The BCB underfill mixture 122 is fed to an edge of the flip-chip 112, and the BCB underfill mixture 122 flows by capillary action to fill interstitially between the flip-chip 112 and the mounting substrate 116. Thereafter, the BCB underfill mixture 122 is cured by thermal processing. The BCB underfill mixture 122 in this example includes the BCB dimer depicted above that is blended with a fluxing agent, about 0.5-5 wt % of the mixture. Additionally, the BCB dimer is prepared with a flow modifier that is a surfactant, about 0.1

3.0 wt of the mixture. The functionalized BCB is also prepared with a deforming agent, about 0.1-2.0 wt % of the mixture.

EXAMPLE 8

In a first alternative to Example 7, the same BCB is prepared as set forth above, and an adhesion promoter, about 0.1-4.0 wt % of the mixture is used.

EXAMPLE 9

In a second alternative to Example 7, the same BCB dimer is prepared, and an inorganic particulate of at least one of fused silica and silver flake is included in the mixture, about 10-80 wt % of the mixture to comprise an underfill composite.

EXAMPLE 10

In another embodiment, Example 10, the process depicted in FIGS. 2A-2D is followed. The BCB underfill mixture 222 is prepared solvent-free and is deposited upon the mounting substrate 216. The flip-chip 212 and the mounting substrate 216 are aligned and brought together. The BCB underfill mixture 222 is first cured by thermal processing, and thereafter the bump 210 is reflowed according to known technique. The BCB underfill mixture 222 in this example is the same underfill mixture depicted in Example 7. Additionally, the BCB dimer is prepared with a flow modifier that is a surfactant, about 0.1-3.0 wt % of the mixture. The BCB dimer is also prepared with a deforming agent, about 0.1-2.0 wt % of the mixture.

EXAMPLE 11

In a first alternative to Example 10, the same BCB dimer is prepared as set forth above, and an adhesion promoter, about 0.1-4.0 wt % of the mixture is used.

EXAMPLE 12

In a second alternative to Example 10, the same BCB dimer is prepared, and an inorganic particulate of at least one of fused silica and silver flake is included in the mixture, about 10-80 wt % of the mixture, to comprise an underfill composite.

Once cured, the BCB underfill mixture exhibits a combination of properties that make the materials an improvement over prior art underfill composites. These properties include low CTE, high Tg, high modulus, low moisture uptake, high heat distortion temperature, high elongation, and low volume shrinkage.

|  | Superoxirane | Benzocyclobutene |
|---|---|---|
| Tensile strength, KSI | 10.7 | 12.5 |
| CTE, ppm/° C. | 33 | [3]45, [4]55 |
| Tg, ° C. |  | >300 |
| Elongation, % | 3.1 | 8.0 |
| Heat Distortion [1]Temperature, ° C. | 280 | 350 |
| [2]Moisture absorption, % | 0.96 | 0.04 |
| Compression Strength, KSI Modulus | 17.2 |  |

[1]264 psi fiber stress.
[2]200 hour water boil.
[3]Below 100° C.
[4]Above 100° C.

Package Assembly

Figures 3A, 3B:
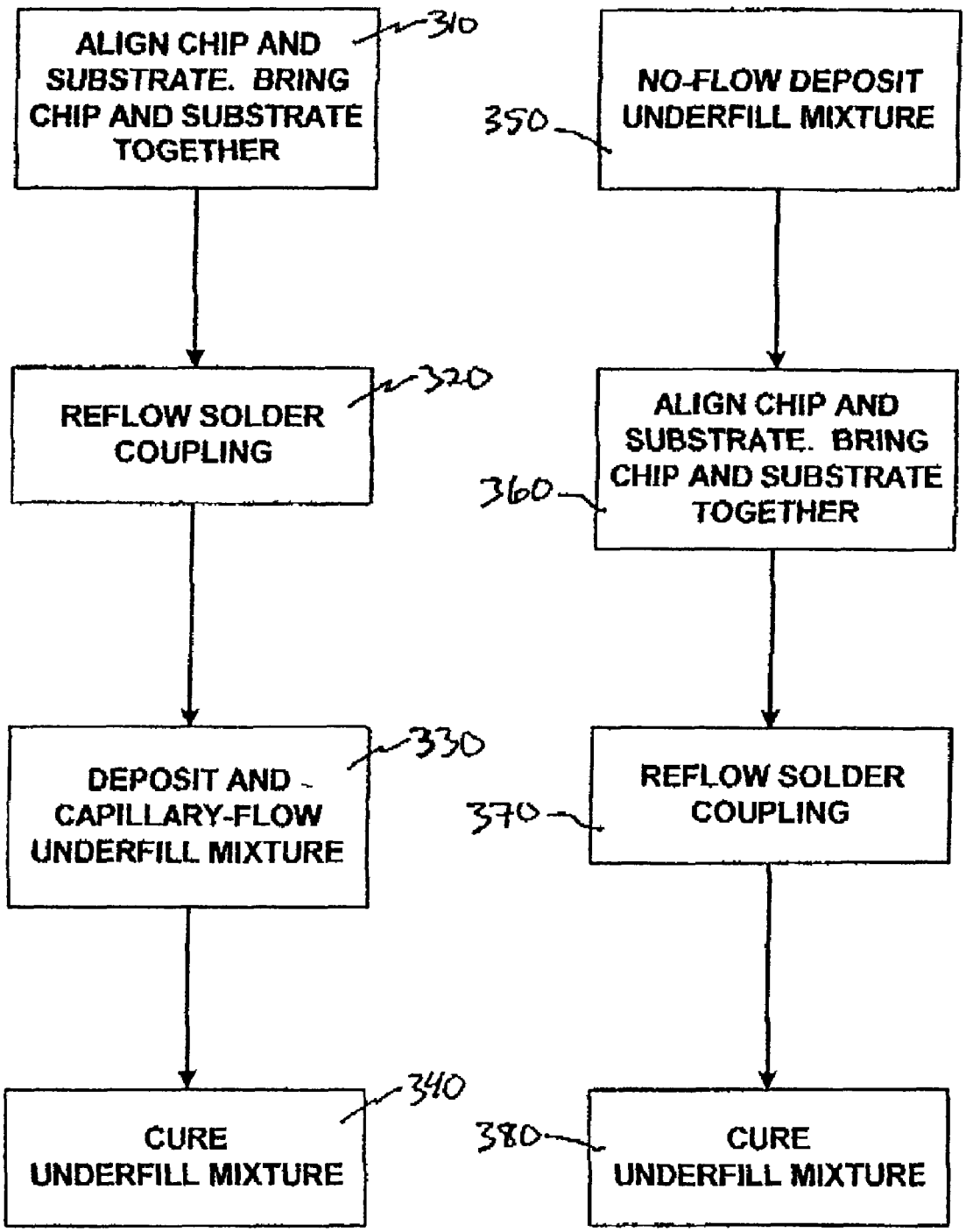
FIG. 3A is a process flow diagram that depicts a packaging process embodiment.
FIG. 3B is a process flow diagram that depicts an alternative packaging process embodiment.

FIG. 3A is a process flow diagram that depicts a packaging process embodiment. Reference may also be made to FIGS. 1A-1D. In 310, a flip-chip and a substrate are aligned and brought together. In 320, the solder that is usually attached to the flip-chip is reflowed and adhered to the bonding pad on the mounting substrate. The solder is a Pb-free solder in one embodiment, and a Pb-containing solder in another embodiment. In 330, an underfill mixture or composite as set forth herein is deposited onto the mounting substrate and the flip-chip, and it flows by at least one of capillary action, positive pressure expulsion, or negative pressure (vacuum) draw. In 340, the underfill mixture or underfill composite is cured. In one embodiment, the cure is a thermal process. In one embodiment, the cure is an autocatalytic process. In one embodiment, the cure is a catalytic process.

FIG. 3B is a process flow diagram that depicts an alternative packaging process embodiment. Reference may also be made to FIGS. 2A-2D. In 350, a no-flow underfill mixture is deposited onto a mounting substrate. Alternatively, the no-flow underfill mixture is deposited onto a flip-chip. In 360, the flip-chip and the substrate are aligned and brought together. In 370, the solder is reflowed and adhered to the bonding pad on the mounting substrate. The solder is a Pb-free solder in one embodiment, and a Pb-containing solder in another embodiment. In 380, the underfill mixture is cured. Alternatively, the processes depicted by 370 and 380 are reversed. In yet another alternative, the processes depicted by 370 and 380 are carried out substantially simultaneously. This means that cure of the underfill mixture starts when heat is applied to reflow the solder, but the cure is not completed before the reflow of the solder is completed. In one embodiment, the cure is a thermal process. In one embodiment, the cure is an autocatalytic process. In one embodiment, the cure is a additive catalytic process. In one embodiment, the cure is a combination of at least two of the above cure processes.

In some embodiments, the underfill mixture is a single-phase liquid. Single-phase liquid underfill mixtures are useful in some semiconductor packaging wherein prior art underfill composites have failed. For example, in semiconductor packages that have tight pitch bumps (that is, the bumps are dense due to their small size) or a small gap height between the chip and the substrate, prior art underfill composites have proven complicated to use because of the increased viscosity of the base resin, the difficulty in flow especially at tight bump pitches, and their poor mechanical properties.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A packaging system comprising:
   a flip-chip on a mounting substrate;
   an underfill mixture between the flip-chip and the mounting substrate, wherein the underfill mixture includes a principal underfill composition of at least one superoxirane in a range from 52 percent to 56 percent of the organic mixture.

2. The packaging system according to claim 1, wherein the underfill mixture further includes:
   at least one additive material selected from an elastomer, a hardener/crosslinker, a catalyst, a reactive diluent, an adhesion promoter, a surfactant, a deforming agent, a fluxing agent, and a toughening agent.

3. The packaging system according to claim 1, wherein the underfill mixture further includes:
   at least one additive material selected from an elastomer, a hardener/crosslinker, a catalyst, a reactive diluent, an adhesion promoter, a surfactant, a deforming agent, a fluxing agent, and a toughening agent; and
   wherein the underfill mixture is a single-phase material.

4. The packaging system according to claim 1, wherein the underfill mixture further includes:
   at least one additive material selected from an elastomer, a hardener/crosslinker, a catalyst, a reactive diluent, an adhesion promoter, a surfactant, a deforming agent, a fluxing agent, a toughening agent, and an inorganic particulate.

5. The packaging system according to claim 1, wherein the principal underfill composition is a oxirane functionalized superoxirane.

6. The packaging system according to claim 1, wherein the principal underfill composition is a functionalized superoxirane that is functionalized in a range from about 5 to about 200.

7. The packaging system according to claim 1, wherein the principal underfill composition is a functionalized superoxirane that is functionalized in a range from about 8 to about 100.

8. The packaging system according to claim 1, wherein the principal underfill composition is a functionalized superoxirane that is functionalized in a range from about 16 to about 64.

9. The packaging system according to claim 1, wherein the principal underfill composition is a functionalized superoxirane that is functionalized in a range from about 5 to about 200, and further including:
   at least one additive material selected from an elastomer, a hardener/crosslinker, a catalyst, a reactive diluent, an adhesion promoter, a surfactant, a deforming agent, a fluxing agent, a toughening agent, and an inorganic particulate.

10. The packaging system according to claim 1, wherein the flip-chip is coupled to the mounting substrate through a conductive bump.

11. The packaging system according to claim 1, wherein the flip-chip is coupled to the mounting substrate through a conductive bump, and wherein the conductive bump includes a Pb-free solder.

12. A chip package comprising:
    a chip including an active surface;
    a mounting substrate including an upper surface that faces the active surface;
    electrical coupling between the active surface and upper surface; and
    an underfill mixture between the upper surface and the active surface, wherein the underfill mixture includes a principal underfill composition of at least one superoxirane; and
    wherein the underfill mixture includes at least one property selected from about 12.5 KSI tensile strength, a coefficient of thermal expansion less than about 60 ppm/° C., and a glass transition temperature greater than about 300° C.

13. The chip package according to claim 12, further including:
    an inorganic filler in the underfill mixture that forms an inorganic-filled underfill composite.

14. The chip package according to claim 12, wherein the underfill mixture is a single-phase mixture.

15. The chip package according to claim 12, wherein the underfill mixture includes the functionalized superoxirane, and further including:
    at least one additive selected from an elastomer, a hardener/crosslinker, a catalyst, a reactive diluent, an adhesion promoter, a surfactant, a deforming agent, a fluxing agent, and a toughening agent.

16. The chip package according to claim 12, wherein the electrical coupling includes a Pb-free solder.

17. The chip package according to claim 12, wherein the principal underfill composition is a functionalized superoxirane that is functionalized in a range from about 5 to about 200.

* * * * *